US012148756B2

(12) United States Patent
Cheng et al.

(10) Patent No.: US 12,148,756 B2
(45) Date of Patent: Nov. 19, 2024

(54) SELECTIVE POLYSILICON GROWTH FOR DEEP TRENCH POLYSILICON ISOLATION STRUCTURE

(71) Applicant: Taiwan Semiconductor Manufacturing Company, Ltd., Hsin-Chu (TW)

(72) Inventors: Yu-Hung Cheng, Tainan (TW); Cheng-Ta Wu, Shueishang Township (TW); Po-Wei Liu, Tainan (TW); Yeur-Luen Tu, Taichung (TW); Yu-Chun Chang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 151 days.

(21) Appl. No.: 17/867,787

(22) Filed: Jul. 19, 2022

(65) Prior Publication Data

US 2022/0352308 A1 Nov. 3, 2022

Related U.S. Application Data

(62) Division of application No. 16/663,659, filed on Oct. 25, 2019, now Pat. No. 11,594,597.

(51) Int. Cl.
*H01L 29/06* (2006.01)
*H01L 21/762* (2006.01)
(Continued)

(52) U.S. Cl.
CPC .... *H01L 27/1203* (2013.01); *H01L 21/76224* (2013.01); *H01L 21/76286* (2013.01);
(Continued)

(58) Field of Classification Search
CPC ............ H01L 29/0649; H01L 29/0653; H01L 29/6681; H01L 21/823481;
(Continued)

(56) References Cited

U.S. PATENT DOCUMENTS 5,914,523 A     6/1999 Bashir et al.
6,207,494 B1 *  3/2001 Graimann ............ H10B 12/038
                                                  257/E21.651
(Continued)

FOREIGN PATENT DOCUMENTS

JP          2006120865 A      5/2006

OTHER PUBLICATIONS

Purdue University Lab (Modeling of growth rates of selective epitaxial growth (seg) and epitaxial lateral overgrowth (elo) of silicon in the sih2cl2—hcl—h2 system) (Year: 1994).*
(Continued)

*Primary Examiner* — Nelson Garces
*Assistant Examiner* — Quinton A Brasfield
(74) *Attorney, Agent, or Firm* — Eschweiler & Potashnik, LLC

(57) ABSTRACT

In some embodiments, the present disclosure relates to an integrated chip that includes a semiconductor device, a polysilicon isolation structure, and a first and second insulator liner. The semiconductor device is disposed on a frontside of a substrate. The polysilicon isolation structure continuously surrounds the semiconductor device and extends from the frontside of the substrate towards a backside of the substrate. The first insulator liner and second insulator liner respectively surround a first outermost sidewall and a second outermost sidewall of the polysilicon isolation structure. The substrate includes a monocrystalline facet arranged between the first and second insulator liners. A top of the monocrystalline facet is above bottommost
(Continued)

surfaces of the polysilicon isolation structure, the first insulator liner, and the second insulator liner.

20 Claims, 14 Drawing Sheets

(51) Int. Cl.
    *H01L 21/763*     (2006.01)
    *H01L 27/12*     (2006.01)

(52) U.S. Cl.
    CPC ........ *H01L 21/763* (2013.01); *H01L 29/0649* (2013.01); *H01L 21/76264* (2013.01)

(58) Field of Classification Search
    CPC ....... H01L 21/823878; H01L 21/76224; H01L 21/76229; H01L 21/76232; H01L 21/763; H01L 21/76286; H01L 21/76264; H01L 21/76879; H01L 21/0228; H01L 21/28562; H01L 21/28506; H01L 21/76897
    See application file for complete search history.

(56) References Cited

U.S. PATENT DOCUMENTS

| | | | | |
|---|---|---|---|---|
| 6,362,064 | B2* | 3/2002 | McGregor | H01L 21/762 438/318 |
| 6,555,891 | B1* | 4/2003 | Furukawa | H01L 21/84 257/E21.651 |
| 2001/0023974 | A1 | 9/2001 | McGregor et al. | |
| 2002/0137269 | A1 | 9/2002 | Ping et al. | |
| 2003/0032257 | A1 | 2/2003 | Wensley et al. | |
| 2004/0009636 | A1 | 1/2004 | Ichinose et al. | |
| 2004/0248369 | A1 | 12/2004 | Wang et al. | |
| 2008/0124889 | A1* | 5/2008 | Roggenbauer | H01L 21/84 257/E27.06 |
| 2008/0173943 | A1 | 7/2008 | Kang | |
| 2009/0160009 | A1* | 6/2009 | Dietz | H01L 23/535 257/E21.546 |
| 2013/0234147 | A1 | 9/2013 | Wu et al. | |
| 2017/0221983 | A1 | 8/2017 | Srinivasan et al. | |
| 2018/0233514 | A1* | 8/2018 | Lee | H01L 29/66681 |
| 2018/0358258 | A1* | 12/2018 | Lee | H01L 21/76264 |
| 2019/0035926 | A1 | 1/2019 | Mohapatra et al. | |

OTHER PUBLICATIONS

Parthasarathy et al. "A 0.25µm CMOS Based 70V Smart Power Technology With Deep Trench for High-Voltage Isolation." IEEE, Digest. International Electron Devices Meeting, Published Feb. 6, 2003.

Wikipedia.org "Avalanche Breakdown" Published Jul. 6, 2019.

Applied Materials, Inc. "Centura RP EPI." Nanochip Technology Journal, vol. 9, Issue 1, published in 2011.

Borg et al. "Facet-Selective Group-III Incorporation in InGaAs Template Assisted Selective Epitaxy." Nanotechnology 30 (2019) 084004 (8pp), published Dec. 31, 2018.

Kongetira et al. "Modeling of Growth Rates of Selective Epitaxial Growth (SEG) and Epitaxial Lateral Overgrowth (ELO) of Silicon in the SiH2Cl2—HClH2 System." Electrical and Computer Engineering Technical Reports, published Oct. 1994.

Wikipedia.org "Silicide" Published Nov. 6, 2018.

Non-Final Office Action dated Dec. 9, 2021 for U.S. Appl. No. 16/663,659.

Final Office Action dated Jun. 22, 2022 for U.S. Appl. No. 16/663,659.

Notice of Allowance dated Oct. 17, 2022 for U.S. Appl. No. 16/663,659.

* cited by examiner

SELECTIVE POLYSILICON GROWTH FOR DEEP TRENCH POLYSILICON ISOLATION STRUCTURE

REFERENCE TO RELATED APPLICATION

This Application is a Divisional of U.S. application Ser. No. 16/663,659, filed on Oct. 25, 2019, the contents of which are hereby incorporated by reference in their entirety.

BACKGROUND

Modern day integrated chips comprise millions or billions of semiconductor devices formed on a semiconductor substrate (e.g., silicon). Integrated chips (ICs) may use many different types of semiconductor devices, depending on an application of an IC. To reduce the area of the IC, the semiconductor devices may be formed in close proximity to one another. To prevent interference amongst the semiconductor devices, techniques and/or features for device isolation in ICs are being researched. Among other things, deep trench isolation structures are a promising candidate to provide electrical isolation amongst semiconductor devices to improve device performance without sacrificing a large area on the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
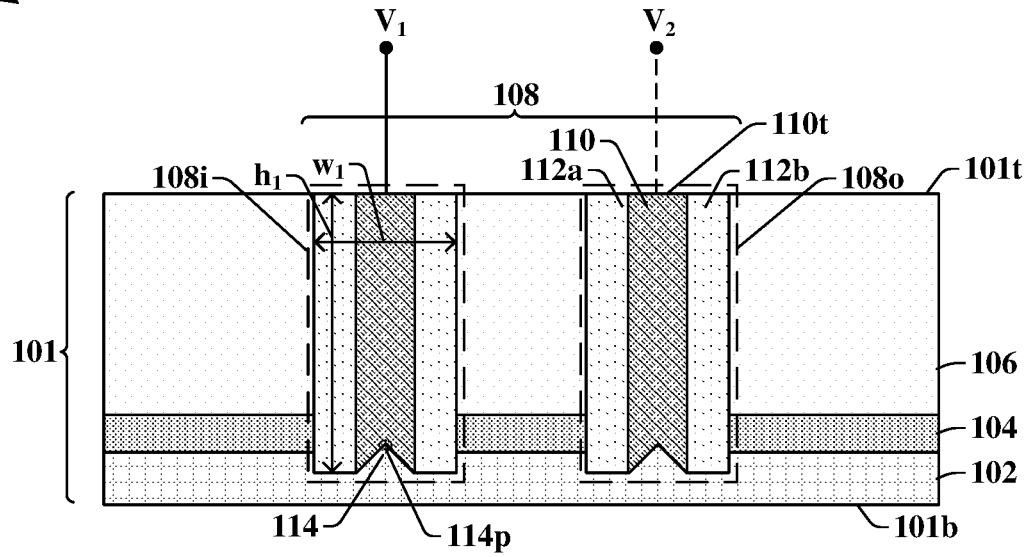
FIGS. 1A, 1B, and 1C illustrate various views of some embodiments of an integrated chip having deep trench isolation (DTI) structures that are substantially free of defects and that surround a semiconductor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some applications, more than one semiconductor device may be integrated onto a same substrate. However, current leakage, cross-talk between the semiconductor devices, and/or eventual device performance degradation may become difficult to prevent as device size decreases and voltage operating conditions increase (e.g., greater than 50 Volts). To mitigate current leakage and device performance degradation, in some embodiments, for example, multiple semiconductor devices may be integrated on a silicon-on-insulator (SOI) substrate comprising an insulator layer between an active layer and a base layer. In other embodiments, to arrange semiconductor devices even closer to one another and provide more reliable device isolation, isolation structures may be formed to electrically separate the semiconductor devices from one another. For example, a deep trench isolation (DTI) structure filled with polysilicon may be formed to continuously surround each of the semiconductor devices. The polysilicon may be doped, and an isolation bias may be applied to the polysilicon during operation in order to achieve electrical isolation and improve device performance.

To form the DTI structure in, for example, an SOI substrate, a trench extending from a top surface of the top substrate to the insulator layer may be formed. An oxide layer is grown to line the trench, and polysilicon may be grown to fill the trench between the oxide layer. The polysilicon may be grown in a furnace and/or epi chamber. However, oftentimes, the polysilicon may grow outward from opposing sidewalls of the trench towards a middle of the trench, and the polysilicon eventually meets in the middle of the trench to form voids in the polysilicon. Voids may compromise the mechanical properties (e.g., yield stress) and the electrical properties (e.g., resistance) of the DTI structure. Further, the polysilicon may have an uneven top surface, requiring a planarization process (e.g., chemical mechanical planarization (CMP)) to planarize a top surface of the DTI structure with the top surface of the top substrate. Besides increasing manufacturing time and cost, the CMP process may also damage the polysilicon, especially if voids are present at a height near the top surface of the top substrate.

Various embodiments of the present disclosure are directed towards a selective polysilicon growth process to mitigate voids in polysilicon and thereby produce a reliable DTI structure. In some embodiments, a trench is formed in, for example, an SOI substrate having an active layer separated from a base layer by an insulator layer. The trench extends through the active layer and into the base layer, such that a horizontally extending surface of the base layer defines a bottom of the trench. An oxide layer is deposited along interior surfaces defining the trench, and an etching process is performed to remove the oxide layer from the horizontally extending surface of the base layer. A selective growth process is performed to grow polysilicon in a bottom-up direction, such that the polysilicon grows from the horizontally extending surface of the base layer to the top surface of the active layer without initiating growth on oxide layer. Further, the selective growth process is performed under conditions to achieve a high growth rate of polysilicon (e.g., greater than 2 micrometers per minute) in order to efficiently fill the trench to form a DTI structure. The selective growth process mitigates trapped voids in the DTI structure, and in some embodiments, eliminates a CMP step, as a top surface of the polysilicon is substantially flat due to bottom-up growth. Thus, the selective growth process provides an efficient and reliable method to produce a DTI structure that effectively electrically isolates a semiconductor device on a substrate.

FIG. 1A illustrates a cross-sectional view 100A of some embodiments of an integrated chip having a deep trench isolation (DTI) structure that extends into a base layer of a silicon-on-insulator (SOI) substrate.

The integrated chip includes DTI structures 108 embedded within a substrate 101. In some embodiments, the substrate 101 may be an SOI substrate and comprises a base layer 102, an insulator layer 104 arranged over the base layer 102, and an active layer 106 arranged over the insulator layer 104. In some such embodiments, the insulator layer 104 is an oxide (e.g., silicon dioxide, germanium oxide). In other embodiments, the substrate may be a bulk substrate comprising a semiconductor material (e.g., silicon, germanium, or the like).

In some embodiments, the DTI structures 108 comprise a first insulator liner 112a and a second insulator liner 112b. A polysilicon isolation structure 110 is arranged between the first and second insulator liners 112a, 112b. The DTI structures 108 extend from a top surface 101t of the substrate 101 (e.g., frontside of the substrate 101) towards a bottom surface 101b of the substrate 101 (e.g., backside of the substrate 101). In some embodiments, the topmost surface 110t of the polysilicon isolation structure 110, top surfaces 112t of the first and second insulator liners 112a, 112b, and the top surface 101t of the substrate 101 are substantially coplanar. In some embodiments, the DTI structures 108 may have a first maximum height $h_1$ that is greater than approximately 7 micrometers. The DTI structures 108 may also have a first maximum width $w_1$, in some embodiments, in a range of between approximately 1.5 micrometers and approximately 3 micrometers. In some embodiments, there are two DTI structures 108, such as, for example, an inner DTI structure 108i and an outer DTI structure 108o, spaced apart from one another by the substrate 101. In other embodiments (not shown), there may be one or more than two DTI structures 108 in the substrate 101. The DTI structures 108 extend completely through the active layer 106 and the insulator layer 104, such that bottom surfaces of the DTI structure 108 directly contact the base layer 102.

Further, in some embodiments, the base layer 102 may comprise a facet 114 that protrudes towards a topmost surface 110t of the polysilicon isolation structure 110. In some embodiments, the base layer 102, which includes the facet 114, is a monocrystalline semiconductor material. For example, the base layer 102 may comprise monocrystalline silicon or monocrystalline germanium. The facet 114, in some embodiments, may comprise a triangular profile from the cross-sectional view 100A. A top point 114p of the facet 114 may be above bottommost surfaces of the DTI structures 108. For example, in some embodiments, the top point 114p of the facet 114 may be above bottommost surfaces of the first and second insulator liners 112a, 112b and/or the polysilicon isolation structure 110. Further, in some embodiments, the top point 114p of the facet 114 may also be above a bottommost surface of the insulator layer 104. The top point 114p of the facet 114 and sidewalls of the facet 114 that meet at the top point 114p may be separated from the first and second insulator liners 112a, 112b by the polysilicon isolation structure 110. Surfaces of the base layer 102 surrounding the facet 114 may directly contact bottom surfaces of the polysilicon isolation structure 110. Thus, the polysilicon isolation structure 110 may comprise, for example, polysilicon that directly contacts the monocrystalline silicon material of the facet 114. In some other embodiments, the polysilicon isolation structure 110 may comprise, for example, doped polysilicon.

In some embodiments, the inner DTI structure 108i may be coupled a first voltage terminal $V_1$, and the outer DTI structure 108o may be coupled to a second voltage terminal $V_2$. In some embodiments, the first voltage terminal $V_1$ and the second voltage terminal $V_2$ may be the same voltage terminal, such that the inner DTI structure 108i and the outer DTI structure 108o have the same bias. Thus, the polysilicon isolation structure 110 in each of the DTI structures 108 may be biased to provide sufficient electrical isolation between various semiconductor devices on the substrate 101.

Figure 1B:
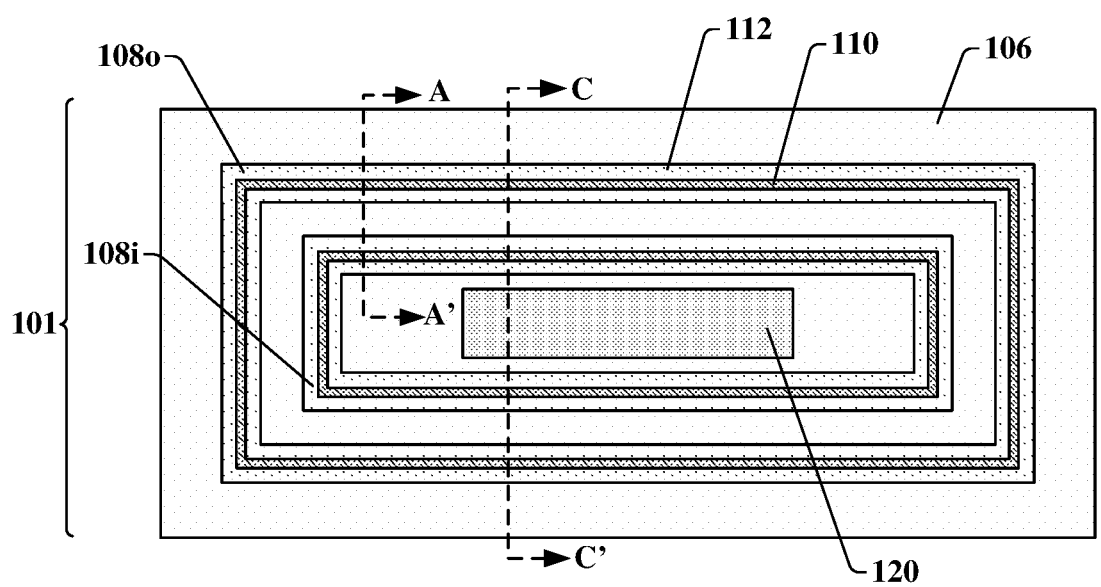

FIG. 1B illustrates a top-view 100B of some embodiments of DTI structures surrounding a semiconductor device.

Figure 1C:
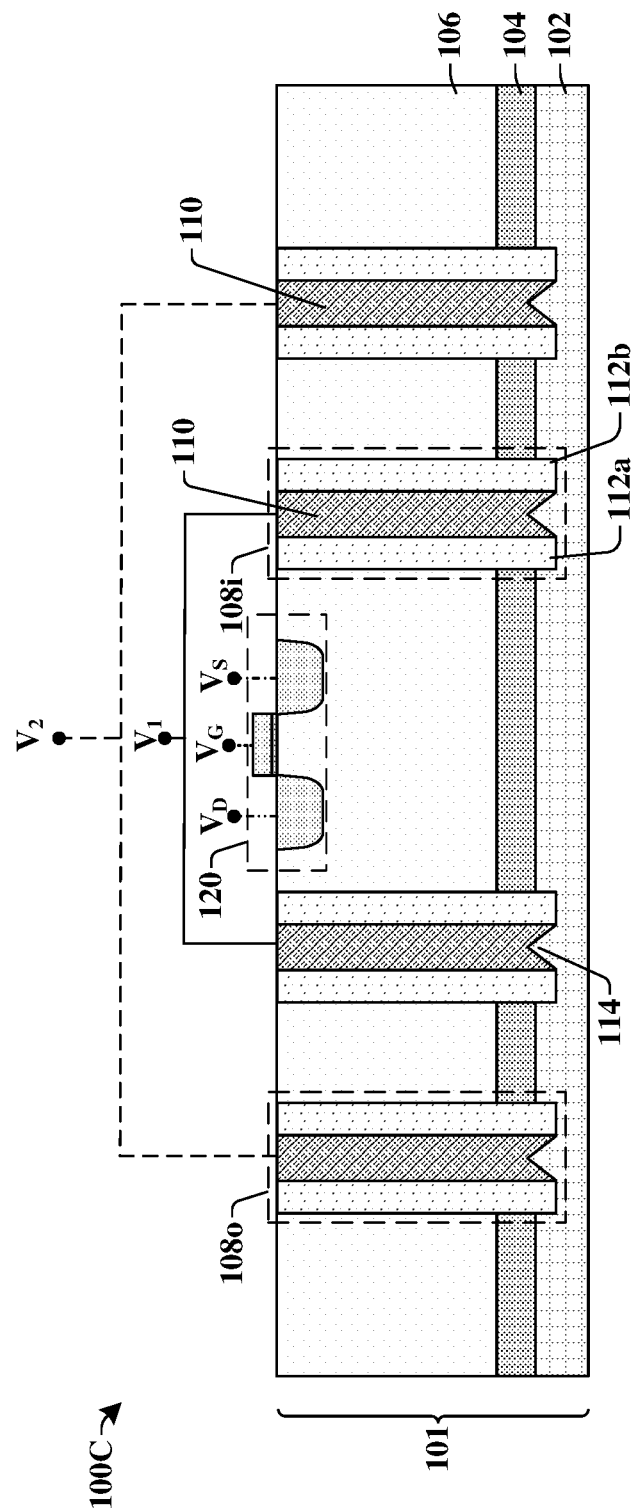

The top-view 100B illustrates the cross-section line AA', which may correspond to the cross-sectional view 100A of FIG. 1A. In some embodiments, the outer DTI structure 108o with insulator liners 112 may continuously surround the inner DTI structure 108i with insulator liners 112, and the inner DTI structure 108i with insulator liners 112 may continuously surround a semiconductor device 120. The DTI structures 108 may respectively exhibit some type of "ring-like" shape, which may mean that they are continuously connected structures. For example, in some embodiments of the top-view 100B, the DTI structures 108 respectively have rectangular-ring-like shapes, whereas in other embodiments, the DTI structures 108 exhibit, for example, circular-ring-like shapes, oval-ring-like shapes, or some other ring-like geometry shape. It will be appreciated that in some embodiments, the outer DTI structure 108o with insulator liners 112 may be omitted to save space on the substrate 101, whereas in other embodiments, more than two DTI structures 108 may be utilized to provide improved electrical isolation of the semiconductor device 120. FIG. 1C illustrates a cross-sectional view 100C some embodiments of an integrated chip corresponding to the cross-section line CC' of FIG. 1B.

In some embodiments, the semiconductor device 120 may be, for example, a transistor device such as a metal oxide semiconductor field effect transistor (MOSFET). In such embodiments, the semiconductor device 120 (e.g., MOSFET), may be disposed on a frontside of the active layer 106 of the substrate 101, and comprise a gate structure coupled to a gate voltage terminal VG, a source region coupled to a source voltage terminal Vs, and a drain region coupled to a drain voltage terminal $V_D$. The inner DTI structure 108i may be spaced apart from the semiconductor device 120, in some embodiments. Nevertheless, the semiconductor device 120 may be disposed in a portion of the active layer 106, surrounded by an insulating material (insulator layer 104, first insulator liner 112a of the inner DTI structure 108i) to aid in electrical isolation of the semiconductor device 120. Further, the inner DTI structure 108i and the outer DTI structure 108o may be sufficiently biased to mitigate leakage of the semiconductor device 120, thereby decreasing power loss and cross-talk amongst other devices integrated on the substrate 101.

Figure 2A:
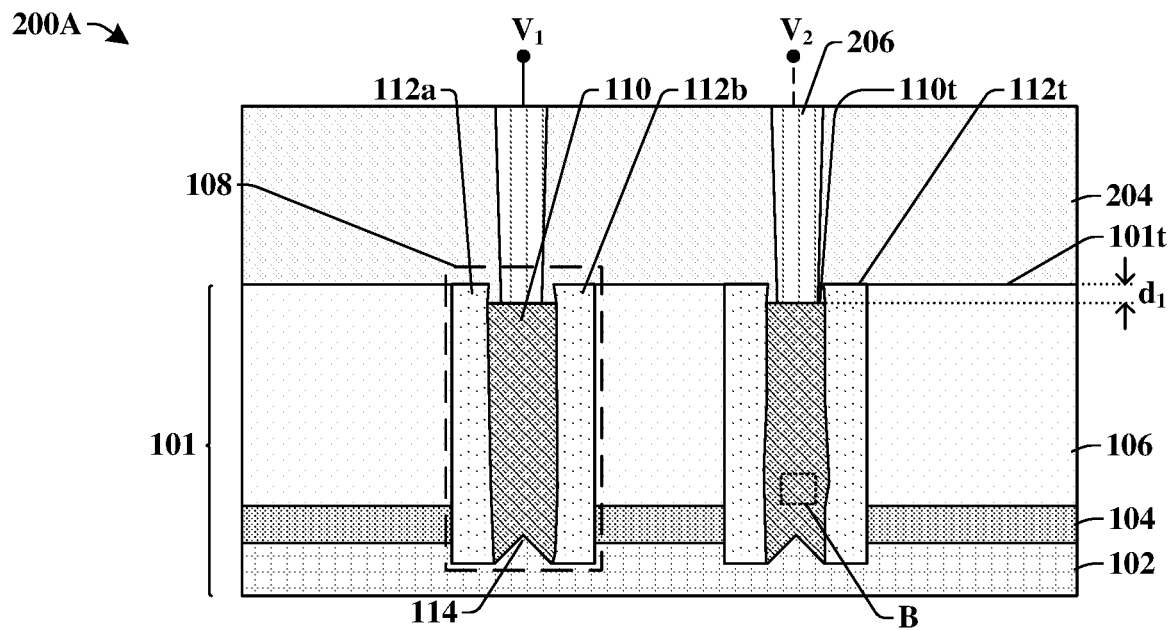
FIGS. 2A and 2B illustrate a cross-sectional view of some additional embodiments of an integrated chip having DTI structures having a polysilicon filling recessed below insulator liners.

FIG. 2A illustrates a cross-sectional view 200A of some additional embodiments of an integrated chip comprising DTI structures in an SOI substrate.

In some embodiments, a dielectric structure 204 overlies the DTI structures 108. Isolation contacts 206 are disposed within the dielectric structure 204 and are coupled to the polysilicon isolation structure 110 of the DTI structures 108. The isolations contacts 206 may be one or more conductive materials that are coupled to the first voltage terminal $V_1$ and the second voltage terminal $V_2$ such that the polysilicon isolation structures may be biased to electrically isolate a semiconductor device (120 of FIG. 1B) on the substrate 101. In some embodiments, the topmost surface 110t of the polysilicon isolation structure 110 may be below the top surfaces 112t of the first and second insulator liners 112a, 112b and the top surface 101t of the substrate 101. For example, in some embodiments, the topmost surface 110t of the polysilicon isolation structure 110 may be below top surfaces of the insulator liners 112a, 112b by a non-zero distance di. In some such embodiments, the top surfaces 112t the first and second insulator liners 112a, 112b and the top surface 101t of the substrate 101 may still be substantially coplanar. Further, in some embodiments, the polysilicon isolation structure 110 may have outer sidewalls that not coplanar from the cross-sectional view 200A, which may be due to, for example, residual effects of the manufacturing of the first and second insulator liners 112a, 112b.

Figure 2B:
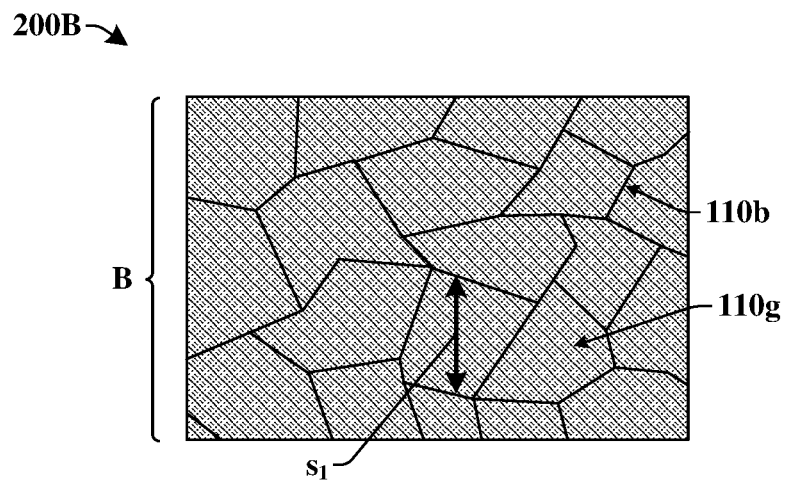

FIG. 2B illustrates some embodiments of a schematic 200B of a grain structure in area B of the polysilicon isolation structure 110 of FIG. 2A.

The schematic 200B of FIG. 2B microscopically shows that the polysilicon isolation structure 110 of FIG. 2B has grains 110g of, for example, polysilicon, separated by grain boundaries 110b. In some embodiments, average grain size si is used to quantify an average size of the grains 110g in a certain area. Average grain size may be calculated from a microstructure image using a variety of techniques, such as a linear intercept method, grain size per area method, and other software methods, for example, Nevertheless, average grain size may be quantified as an average grain size diameter (e.g., length, width, height). Further, many factors affect the average grain size of a material, such as processing methods, processing conditions (e.g., temperature, pressure, etc.), and composition, for example. In some embodiments, the polysilicon isolation structure 110 may have an average grain size si greater than approximately 300 nanometers, which, in some embodiments, may indicate a high growth rate of the polysilicon during manufacturing.

Figure 3:
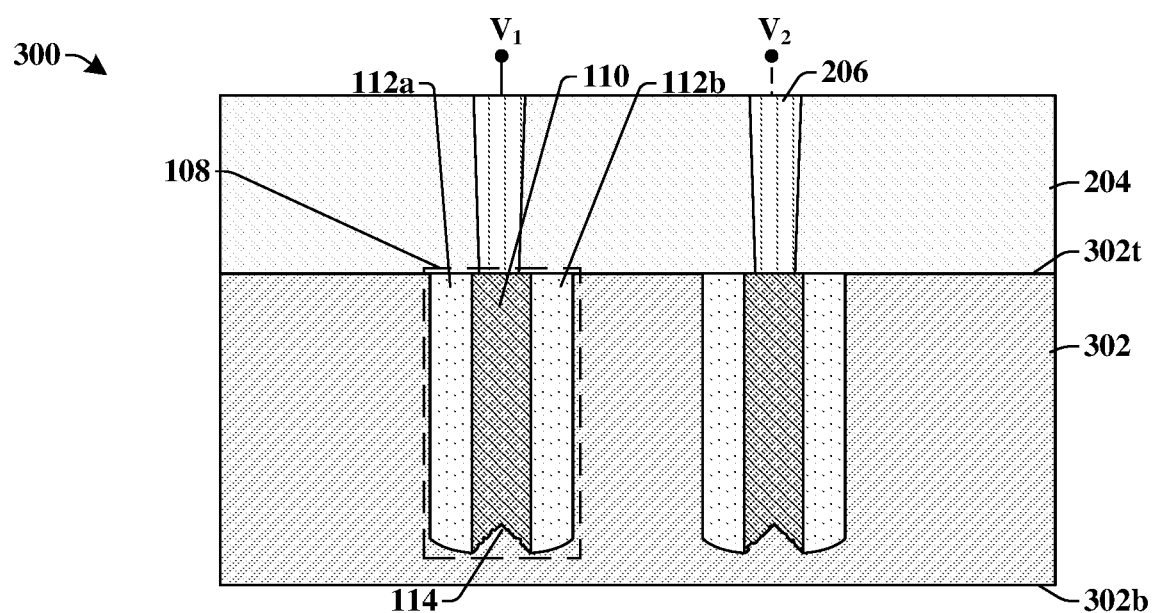
FIG. 3 illustrates a cross-sectional view of some additional embodiments of an integrated chip having DTI structures in a bulk semiconductor substrate.

FIG. 3 illustrates a cross-sectional view 300 of some embodiments of an integrated chip comprising DTI structures in a substrate.

In some embodiments, the DTI structures 108 may be embedded within a single substrate 302 that includes a same semiconductor material extending between a top surface and a bottom surface of the single substrate 302. In some such embodiments, to compensate for the lack of an insulator layer (104 of FIG. 1A), more DTI structures 108 may be arranged around a same semiconductor device under the same conditions when using a single substrate 302 instead of an SOI substrate (101 of FIG. 1A). In other embodiments, one DTI structure 108 may still be sufficient to isolate a semiconductor device on the single substrate 302.

In some embodiments, the first and second insulator liners 112a, 112b may have bottom surfaces that are rounded, which may be due to, in part, processing conditions. In some embodiments, the single substrate 302 may be a monocrystalline semiconductor material (e.g., monocrystalline silicon). In some embodiments, the single substrate 302 comprises the facet 114. Thus, in such embodiments, the facet 114 is also the same monocrystalline semiconductor material as the single substrate 302. In some embodiments, the facet 114 may exhibit an overall triangular shape, but have rough or non-coplanar edges from the cross-sectional view 300. The DTI structures 108 may extend from a top surface 302t of the single substrate 302 towards a bottom surface 302b of the single substrate 302, without extending completely through the single substrate 302. Nevertheless, in some embodiments, the facet 114 may have a top that is arranged above bottommost surfaces of the first and second insulator liners 112a, 112b. The DTI structures 108 may extend near the bottom surface 302b of the single substrate 302 to provide as much electrical isolation as possible without sacrificing the mechanical strength of the single substrate 302. For example, in some embodiments, lower surfaces of the DTI structures 108 may be spaced at a distance from the bottom surface 302b of the single substrate 302 in range of between 10 and 100 nanometers.

FIGS. 4-15 illustrate cross-sectional views and top-views 400-1400 of some embodiments of a method of forming a deep trench isolation (DTI) structure having a polysilicon isolation structure that is substantially free of defects for reliable electrical isolation. Although FIGS. 4-15 are described in relation to a method, it will be appreciated that the structures disclosed in FIGS. 4-15 are not limited to such a method, but instead may stand alone as structures independent of the method.

Figure 4:
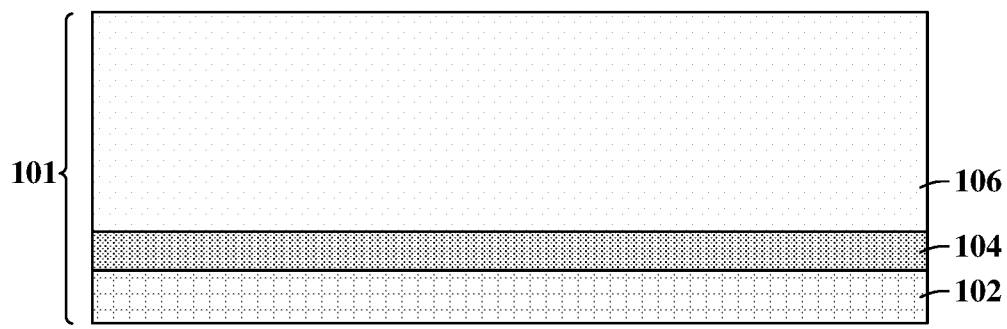
FIGS. 4, 5, 6A, 6B, 7, 8A, 8B, 9, 10A, 10B, 11A, 11B, 11C, 11D, and 12-15 illustrate various cross-sectional views and top-views of some embodiments of a method of forming DTI structures using a selective growth process to mitigate the formation of voids during the growth of polysilicon.

As shown in the cross-sectional view 400 of FIG. 4, a substrate 101 is provided. The substrate 101 may be a silicon-on-insulator substrate, comprising a base layer 102, an insulator layer 104 over the base layer 102, and an active layer 106 over the insulator layer 104. In some embodiments, the base layer 102 comprises a monocrystalline semiconductor material (e.g., silicon, germanium, etc.). Similarly, the active layer 106 may also comprise a semiconductor material, such as for example, silicon, germanium, or the like. In some embodiments, the active layer 106 may comprise p-type silicon, for example, doped with boron. In such embodiments, the doping concentration of the active layer 106 may be, for example, $10^{15}$ dopant atoms (e.g., boron) per cubic centimeter. In other embodiments, the substrate 101 may comprise any type of semiconductor body (e.g., silicon/CMOS bulk, SiGe, etc.). In some embodiments, the active layer 106 has a thickness in a range of between, for example, approximately 6.5 micrometers and approximately 7.5 micrometers. In other embodiments, the active layer 106 has a thickness equal to approximately 7 micrometers. In some embodiments, the insulator layer 104 may be a bulk oxide comprising, for example, silicon oxide. In other embodiments, the insulator layer 104 may comprise, for example, a nitride, a carbide, or some other dielectric material. The insulator layer 104 may have a thickness in a range of between, for example, approximately 0.2 micrometers and approximately 0.4 micrometers. In other embodiments, the insulator layer 104 may have a thickness equal to approximately 0.3 micrometers.

Figure 5:
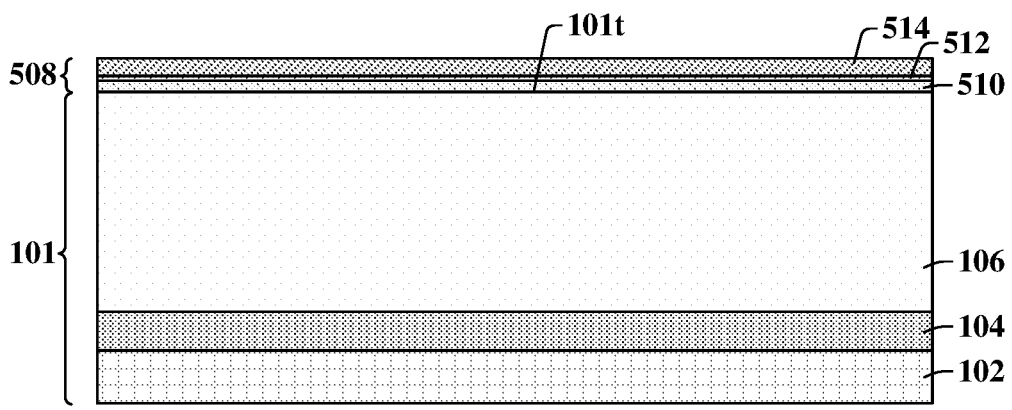

As shown in the cross-sectional view 500 of FIG. 5, a masking structure 508 is formed over a top surface 101t of the substrate 101. The masking structure 508 may be used, for example, for patterning and also for protection of the substrate 101. In some embodiments, the masking structure 508 comprises one or more hard mask layers (e.g., a silicon nitride layer, a silicon carbide layer, or the like). For example, in the cross-sectional view 500, the masking structure 508 may comprise a stack of a first oxide layer 510 comprising silicon oxide, a first nitride layer 512 comprising silicon nitride, and a second oxide layer 514 comprising silicon oxide. In some embodiments, the first oxide layer 510 may be a native oxide grown on the top surface 101t of the substrate 101. The masking structure 508 may be formed by one or more deposition techniques (e.g., physical vapor deposition (PVD), chemical vapor deposition (CVD), PE-CVD, atomic layer deposition (ALD), sputtering, etc.).

Figure 6A:
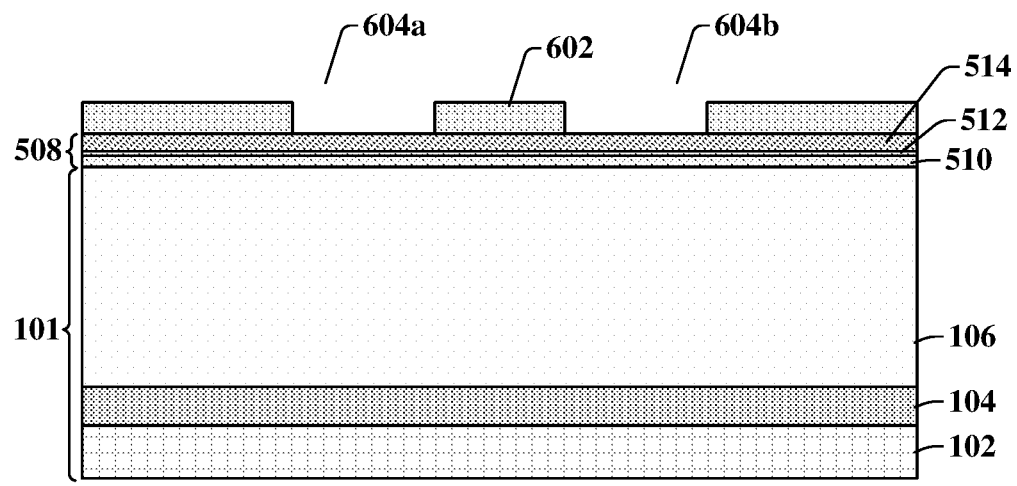

As shown in the cross-sectional view 600A of FIG. 6A, a photoresist layer 602 may be deposited over the masking structure 508 and patterned to define a first opening 604a and a second opening 604b. The photoresist layer 602 may be deposited via a spin coating process. The photoresist layer 602 may then be selectively exposed to electromagnetic radiation according to a photomask. The electromagnetic radiation modifies a solubility of exposed regions within the photoresist layer 602 to define soluble regions. The photoresist layer 602 is subsequently developed to define the first opening 604a and the second opening 604b after removing the soluble regions.

Figure 6B:
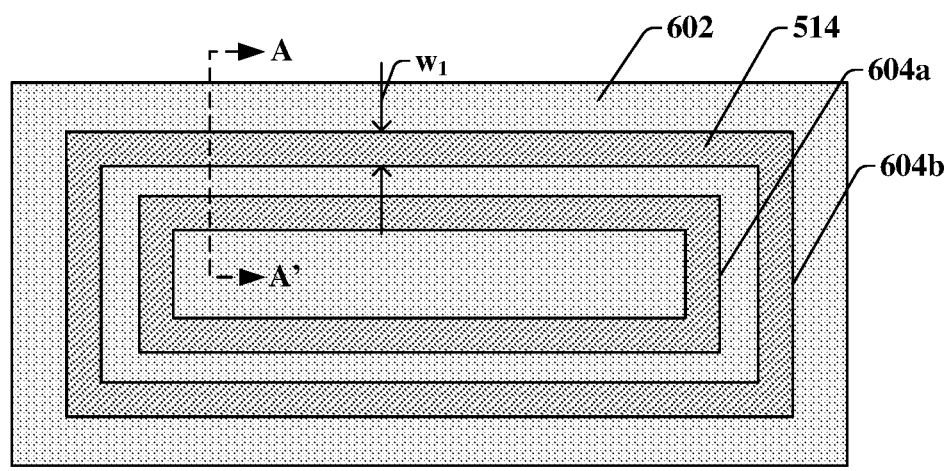

In some embodiments, the cross-sectional view 600A corresponds to an embodiment along the cross-section line AA' in the top-view 600B of FIG. 6B.

From the top-view 600B, the first opening 604a and the second opening 604b in the photoresist layer 602 are continuously connected openings. The first opening 604a and the second opening 604b expose areas of the second oxide layer 514 of the mask structure (508 of FIG. 6A). The first opening 604a and the second opening 604b will define inner and outer deep trench isolation (DTI) structures (108i, 108o of FIG. 1A). However, in other embodiments, an integrated chip includes just one DTI structure per semiconductor device, for example, and thus, one of either the first opening 604a or the second opening 604b would be formed in the photoresist layer 602. Nevertheless, multiple DTI structures may be simultaneously formed in the substrate (101 of FIG. 6A). In some embodiments, the first and second openings 604a, 604b may each have a first maximum width $w_1$ in a range of between, for example, approximately 1.5 micrometers and approximately 3 micrometers.

Figure 7:
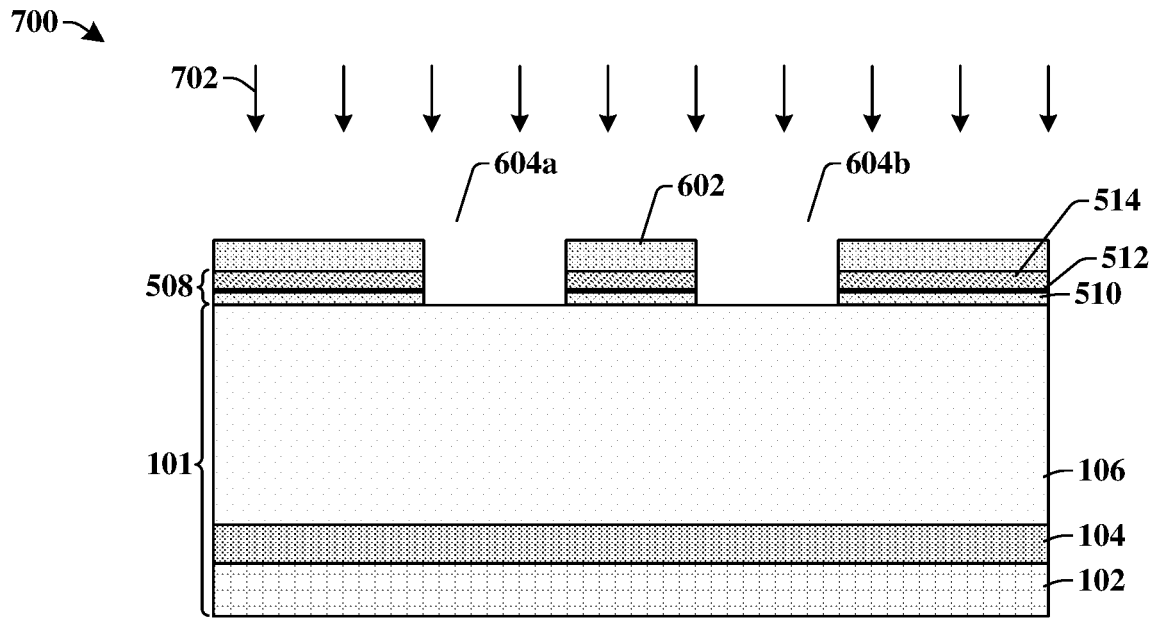

As shown in the cross-sectional view 700 of FIG. 7, a first etching process 702 (e.g., wet etch, dry etch) may be conducted to remove portions of the masking structure 508 uncovered by the photoresist layer 602. After the first etching process 702, the first and second openings 604a, 604b extend through the masking structure 508 to expose portions of the substrate 101.

Figure 8A:
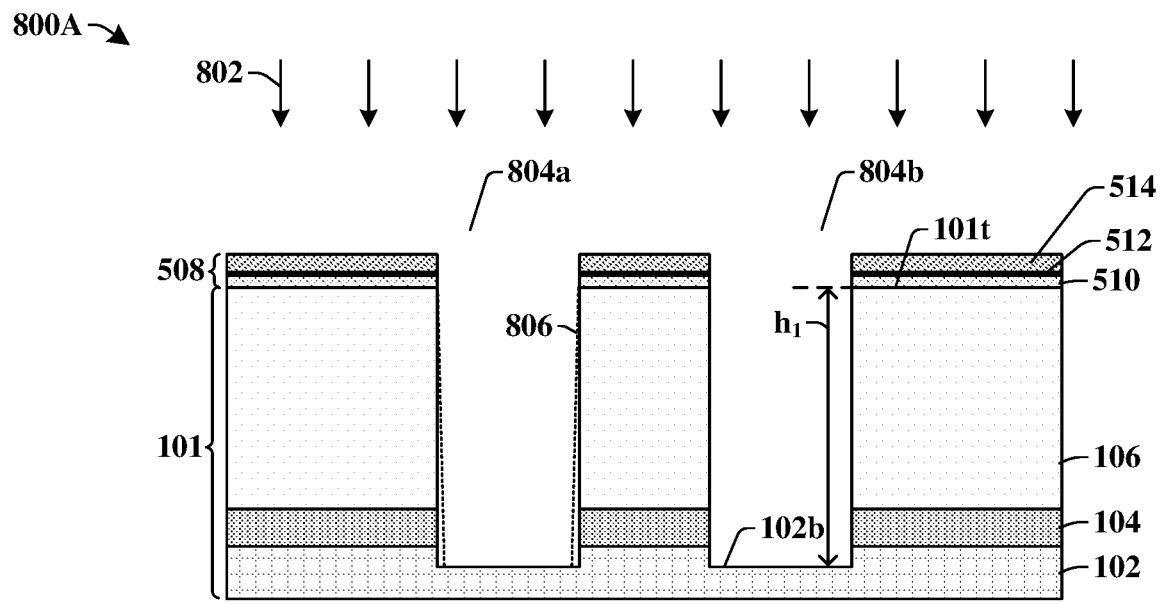

As shown in the cross-sectional view 800A of FIG. 8A, the photoresist layer (602 of FIG. 7) may be stripped, and a second etching process 802 is performed to create a first trench 804a and a second trench 804b within the substrate 101 defined by the first and second openings (604a, 604b of FIG. 7). In some embodiments, the second etching process 802 utilizes a dry etchant instead of a wet etchant to achieve substantially coplanar sidewalls of the first and second trenches 804a, 804b. The sidewalls of the first and second trenches 804a, 804b are defined by inner surfaces of the substrate 101. In some embodiments, the first and second trenches 804a, 804b have substantially vertical sidewalls, whereas in other embodiments, the first and second trenches 804a, 804b may have angled sidewalls as illustrated by the dotted lines 806. In embodiments where the substrate 101 is an SOI substrate, the first and second trenches 804a, 804b extend into the base layer 102, such that horizontally extending surfaces 102b of the base layer 102 defines the bottom of the first and second trenches 804a, 804b. In some embodiments, the first and second trenches may have a first maximum height $h_1$ measured from the top surface 101t of the substrate 101 that is greater than approximately 7 micrometers.

Figure 8B:
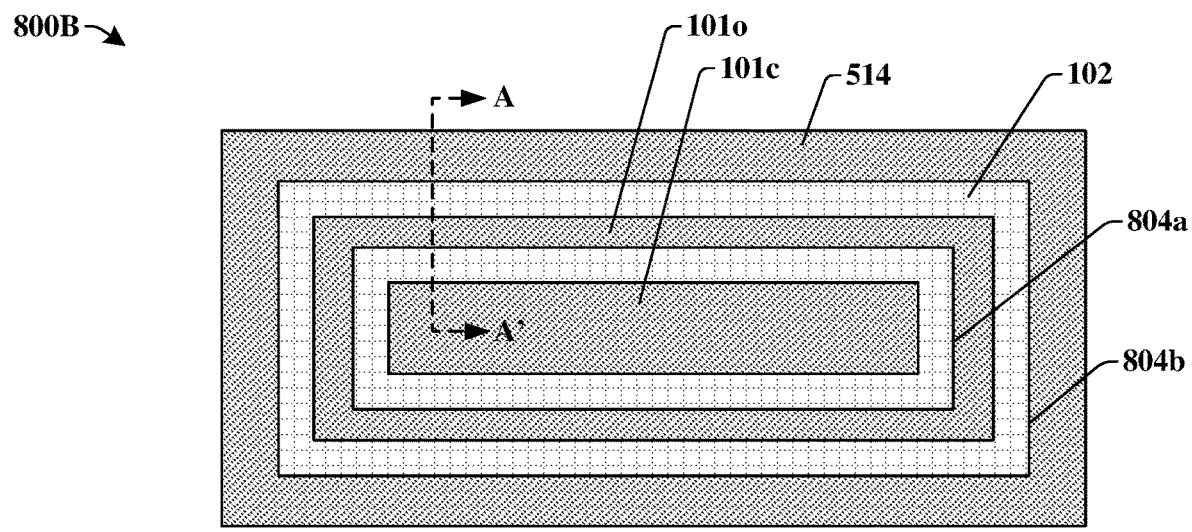

In some embodiments, the cross-sectional view 800A corresponds to an embodiment along the cross-section line AA' in the top-view 800B of FIG. 8B.

From the top-view 800B, the base layer 102 is uncovered by the second oxide layer 514 of the masking structure (508 of FIG. 8A). It will be appreciated that in some embodiments, the first and second trenches 804a, 804b each have a rectangular-ring-like shape, whereas in other embodiments, the first and second trenches 804a, 804b each exhibit, for example, a circular-ring-like shape, oval-ring-like shape, or some other ring-like (e.g., continuously connected) geometry shape. The first trench 804a may continuously surround a central portion 101c of the substrate 101 and separate a central portion 101c of the substrate 101 from an outer portion 101o of the substrate 101.

Figure 9:
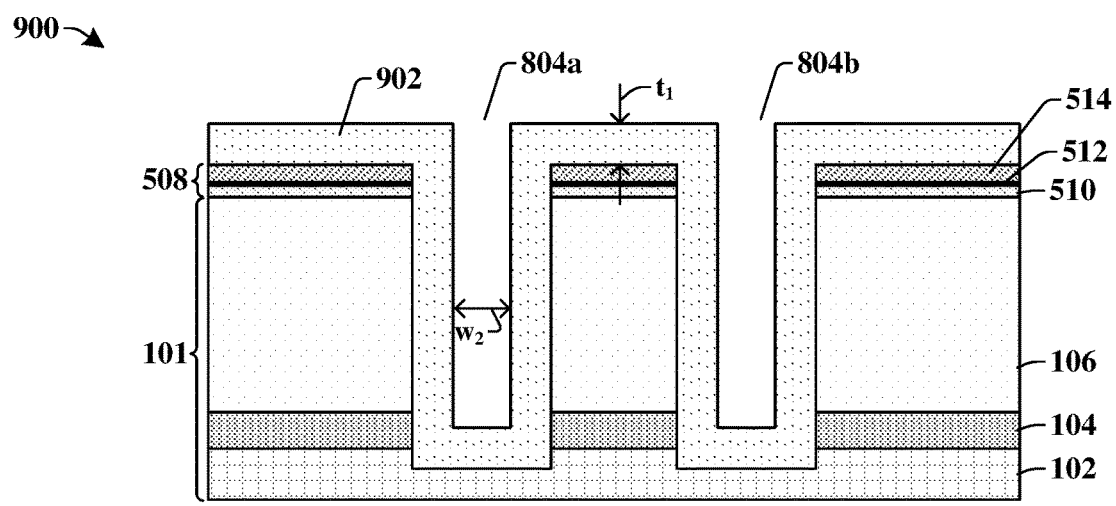

As shown in the cross-sectional view 900 of FIG. 9, a conformal oxide layer 902 is grown over the substrate 101. In some embodiments, the conformal oxide layer 902 is formed in a furnace chamber by a thermal growth process. In some embodiments, the conformal oxide layer 902 may be formed by a deposition process (e.g., CVD, PE-CVD, or the like). In some embodiments, the conformal oxide layer 902 may comprise an oxide, such as, for example, silicon oxide. In other embodiments, the conformal oxide layer 902 may comprise some other dielectric material such as silicon carbide, silicon oxide, or silicon oxynitride, for example. Further, in some embodiments, the conformal oxide layer 902 may have a first thickness ti in a range of between, for example, approximately 300 nanometers and approximately 500 nanometers. In some embodiments, the first and second trenches 804a, 804b are not fully filled with the conformal oxide layer 902, and a cavity having a second maximum width $w_2$ remains between the conformal oxide layer 902. In some embodiments, the second maximum width $w_2$ is in a range of between, for example, approximately 400 nanometers and approximately 500 nanometers.

Figure 10A:
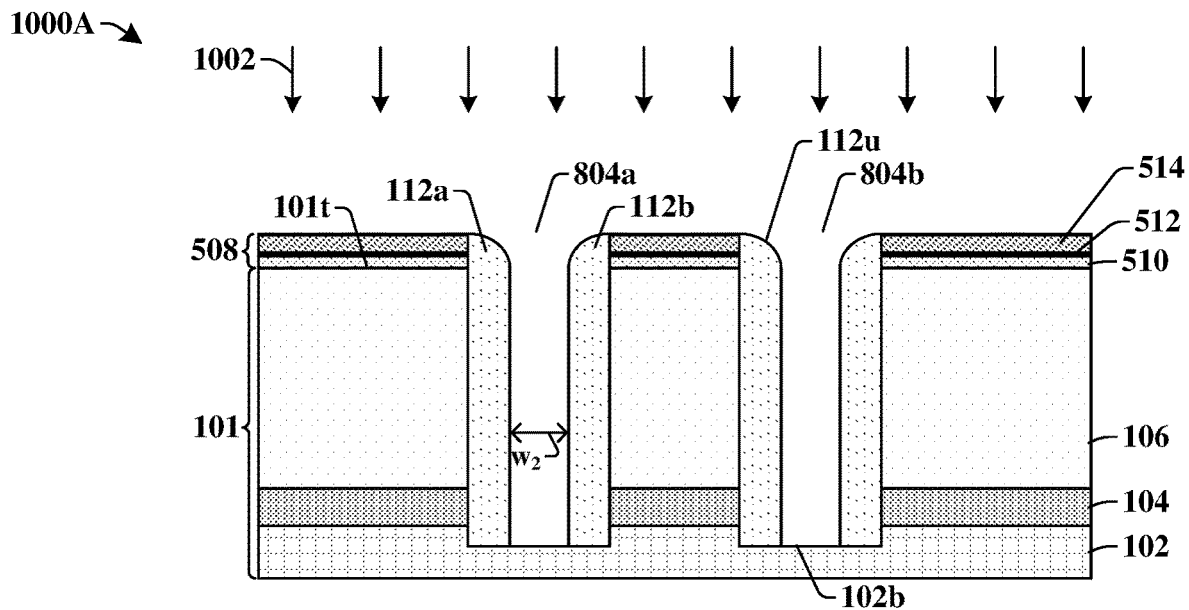

As shown in the cross-sectional view 1000A of FIG. 10A, a third etching process 1002 is performed to remove portions of the conformal oxide layer (902 of FIG. 9) along horizontally extending surfaces, such that a first insulator liner 112a and a second insulator liner 112b remain. The first insulator liner 112a and the second insulator liner 112b cover sidewalls of the first trench 804a and the second trench 804b, respectively. The third etching process 1002 removes the conformal oxide layer (902 of FIG. 9) from the bottom of the first and second trenches 804a, 804b such that after the third etching process 1002, horizontally extending surfaces 102b of the base layer 102 are exposed. In some embodiments, the third etching process 1002 utilizes a vertical dry etchant, such that a masking layer is not needed. As a result of the third etching process 1002, upper sidewalls 112u of the first and second insulator liners 112a, 112b may have rounded edges. In other words, the thickness of upper portions of the first and second insulator liners 112a, 112b may be less than the thickness of lower portions of the first and second insulator liners 112a, 112b, in some embodiments. In some embodiments, the masking structure 508 may decrease in height due to residual effects of the third etching process 1002. Nevertheless, the masking structure 508 may still cover a top surface 101t of the substrate 101.

Figure 10B:
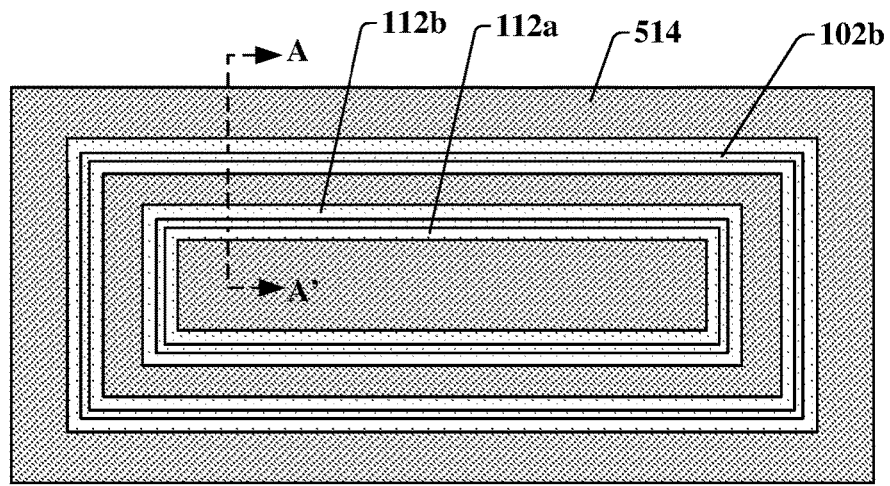

In some embodiments, the cross-sectional view 1000A corresponds to an embodiment along the cross-section line AA' in the top-view 1000B of FIG. 10B.

From the top-view 1000B, the horizontally extending surfaces 102b of the base layer 102 are not covered by an oxide. It will be appreciated that the base layer 102 is a wafer that has, in some embodiments, an overall circular shape. In some embodiments, at this point in manufacturing, at least 50 percent of the top surface area of the substrate 101 (e.g., wafer) is covered by an oxide. Thus, less than 50 percent of the top surface area of the wafer comprising the substrate 101 is the horizontally extending surfaces 102b of the base layer 102, which is an exposed semiconductor material (e.g., silicon). By having at least 50 percent of the top surface area of the wafer covered by an oxide, the growth rate of polysilicon (see, FIGS. 11A-D) from the horizontally extending surfaces 102b of the base layer 102 is increased. Further, in some other embodiments, at this point in manufacturing, at least 98 percent of the top surface area of the substrate 101 (e.g., wafer) is covered by an oxide. Thus, in such other embodiments, less than 2 percent of the top surface area of the wafer comprising the substrate 101 is the horizontally extending surfaces 102b of the base layer 102, which is an exposed semiconductor material (e.g., silicon). By having at least 98 percent of the top surface area of the wafer covered by an oxide, the growth rate of polysilicon (see, FIGS. 11A-D) from the horizontally extending surfaces 102b of the base layer may be 2-3 times greater than by having about 50 percent of the top surface area of the wafer covered by an oxide. In yet some other embodiments, the horizontally extending surfaces 102b of the base layer 102 that are exposed in the top-view 1000B is equal to about 1.29 percent of the top surface area of wafer that comprises the substrate 101. In other words, from the top-view 1000B, in some embodiments, the second oxide layer 514 has a first total surface area on the wafer, the first and second insulator liners 112a, 112b have a second total surface area on the wafer, and the horizontally extending surfaces 102b of the base layer 102 that are exposed on the wafer have a third total surface area. A sum of the first, second, and third total surface area may be equal to, for example, a fourth total surface area. In some embodiments, the ratio of the third total surface area to the fourth total surface area may be less than about 50. In other embodiments, the ratio of the third total surface area to the fourth total surface area may, for example, be less than or equal to about 1.3.

Figure 11A:
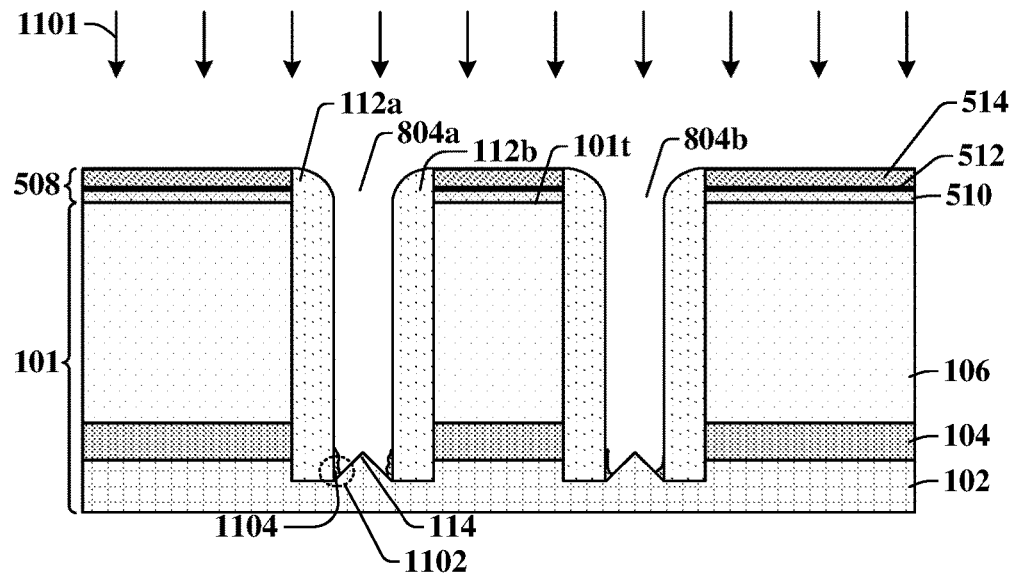
Figure 11B:
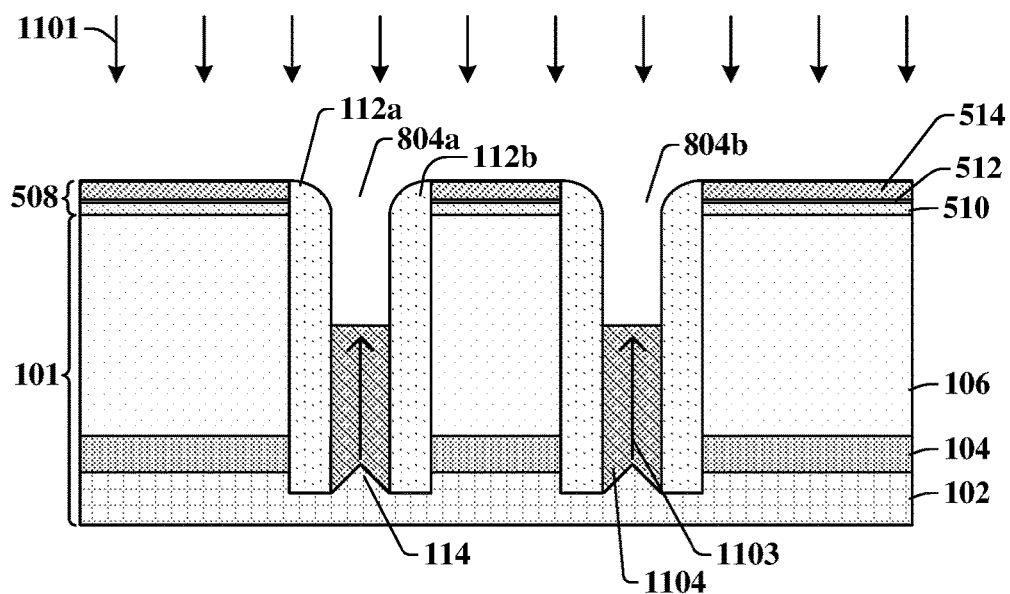
Figure 11C:
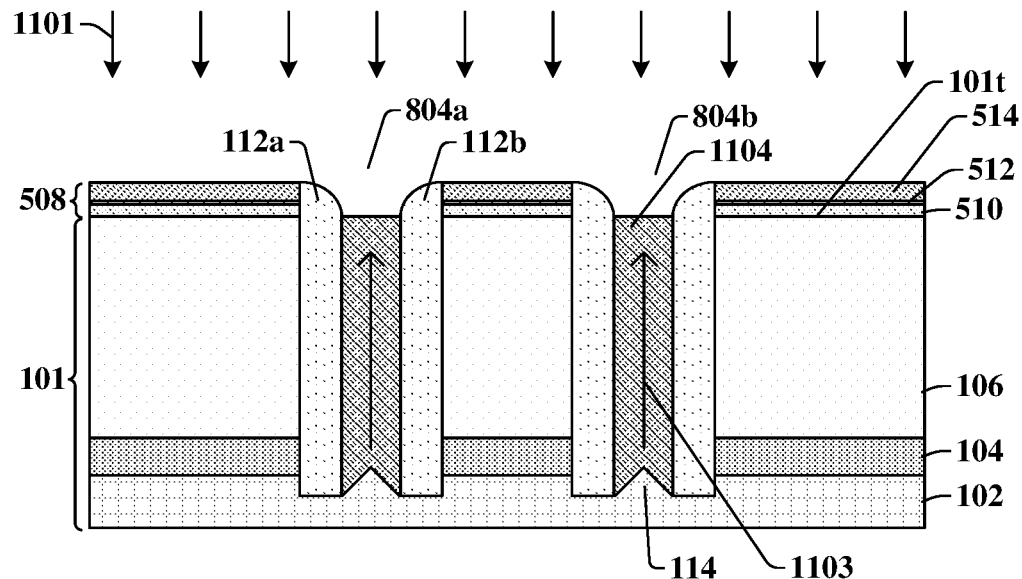
Figure 11D:
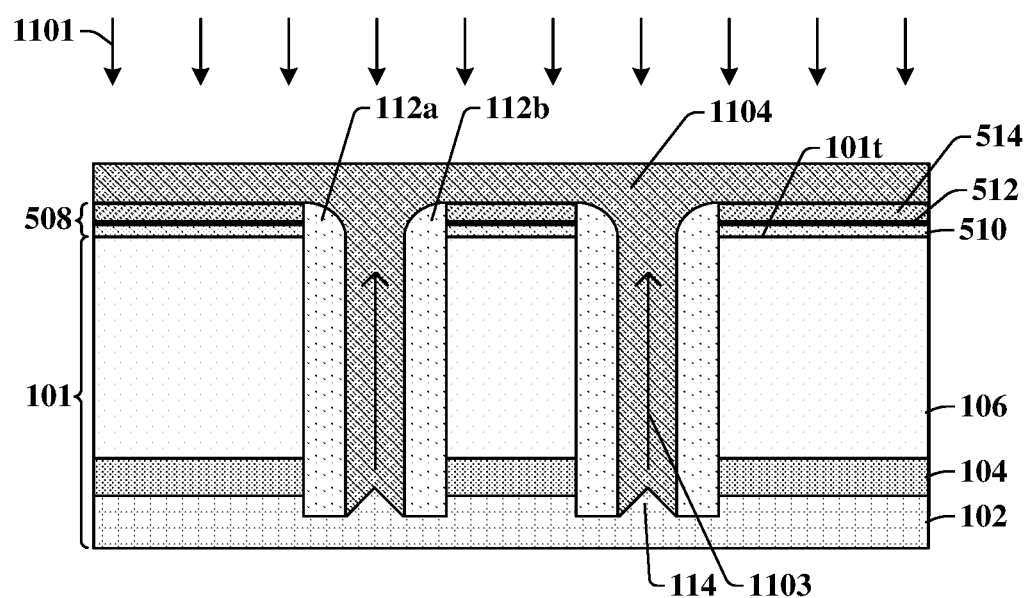

FIGS. 11A-11D illustrate cross-sectional views 1100A of some embodiments of a polysilicon growth process 1101 at different times. For example, FIG. 11A illustrates a cross-sectional view 1100A at a time just after the polysilicon growth process began, whereas FIG. 11D illustrates a cross-sectional view 1100D at a time near the end of the polysilicon growth process.

The polysilicon growth process 1101 is performed to fill the first and second trenches 804a, 804b with polysilicon. The substrate 101 may be loaded into a chamber for physical vapor deposition (PVD) or chemical vapor deposition (CVD) processes. In some embodiments, the substrate 101 is loaded into a low pressure CVD (LPCVD) chamber. The chamber conditions are adjusted such that the polysilicon growth process 1101 has a fast growth rate to fill the first and second trenches 804a, 804b and has a high selectivity to the base layer 102 (e.g., silicon) and not to the oxides (first insulator liner 112a, second insulator liner 112b, second oxide layer 514). A fast growth rate is desired to increase throughput, considering the first and second trenches 804a, 804b may have a first height ($h_1$ of FIG. 8A) that is greater than 7 micrometers, which is large for typical polysilicon growth processes. Further, a high selectivity to the base layer 102 is desired such that the polysilicon grows in a bottom-up direction. For example, the first and second trenches 804a, 804b extend into the substrate 101 in a first direction that is normal to the top surface 101t of the substrate 101, whereas the polysilicon growth process 1101 is controlled to grow in a second direction that is also normal to the top surface 101t of the substrate 101 and is opposite to the first direction.

In some embodiments, to promote a high growth rate, the temperature of the chamber is set to be in a range of between, for example, approximately 850 degrees Celsius and approximately 1100 degrees Celsius, and the pressure of the chamber may be set in a range of between, for example, approximately 10 Torr and approximately 300 Torr. Further, a high oxide surface area coverage may promote a high growth rate of polysilicon. Thus, as presented above regarding FIG. 10B, at least 50 percent of the top surface area of the substrate 101 (e.g., wafer) is covered by an oxide (first insulator liner 112a, second insulator liner 112b, second oxide layer 514). Thus, less than 50 percent of the top surface area of the substrate 101 (e.g., wafer) is the horizontally extending surfaces 102b of the base layer 102, which is an exposed semiconductor material (e.g., silicon), to promote a high growth rate of polysilicon.

Further, the above temperature and pressure parameters, as well as the components and concentrations of the first precursor, may aid in a high selectivity of polysilicon growth onto the exposed semiconductor material (e.g., silicon) of the base layer 102. For example, in some embodiments, the first precursor may comprise dichlorosilane gas (DCS) for silicon growth, hydrochloride gas (HCl) for defect removal during growth, and boron gas ($B_2H_6$) for doping the silicon during growth. In some embodiments, a ratio of the HCl to the DCS in the chamber during the polysilicon growth process 1101 is in a range of about 2 and about 8. In other embodiments, the ratio of the HCl to the DCS in the chamber is above 5 to mitigate particle formation defects in the oxide and below 10 to prevent too large of an etching effect by the HCl that polysilicon growth is very slow. As the ratio of HCl to DCS increases, the more selective the polysilicon growth process 1101 is to silicon. In some embodiments, the HCl flows into the chamber at a rate of approximately 400 standard cubic centimeters per minute, and the DCS flows into the chamber at a rate in a range of between approximately 70 standard cubic centimeters per minute and approximately 200 standard cubic centimeters per minute. In some embodiments, the $B_2H_6$ flows into the chamber at a rate of approximately 200 standard cubic centimeters per minute. In some embodiments, the polysilicon 1104 may have concentration of boron that is in a range of between approximately $2\times10^{18}$ dopant atoms (e.g., boron) per cubic centimeter and approximately $10^{19}$ dopant atoms (e.g., boron) per cubic centimeter. Thus, in some embodiments, the polysilicon 1104 may have a higher concentration of dopants than the active layer 106. Further, in some embodiments, the active layer 106 and the polysilicon 1104 may have a same doping type.

As illustrated in the cross-sectional view 1100A of FIG. 11A, in some embodiments, during a first time of the polysilicon growth process 1101, a facet 114 is formed that is part of the base layer 102. Thus, in some embodiments, the facet 114 and the base layer 102 are part of the same monocrystalline silicon. The facet 114 is formed as a result of the high selectivity of the polysilicon growth process 1101. The DCS causes the exposed base layer 102 to grow as monocrystalline silicon, but the HCl etches away portions of the growing monocrystalline silicon. The facet 114 is the monocrystalline silicon that remains. The facet 114 comprises mainly (111) planes of the silicon, as the (111) planes have the highest packing density and thus, highest surface energy compared to other lattice planes in the silicon structure. Thus, the (111) planes of the silicon may resist etching by the HCl, and the facet 114 resembles a triangle-like protrusion of the base layer 102. The facet 114 is above a bottommost surface of the first and second insulator liners 112a, 112b because the facet 114 is a result of the polysilicon growth process 1101, and thus, is grown after the formation of the first and second trenches 804a, 804b.

In some embodiments, polysilicon 1104 begins to grow at the crevice 1102 between the facet 114 and one of the first or second insulator liners 112a, 112b. Thus, the polysilicon growth process 1101 is selective to the monocrystalline silicon, and the growth changes from monocrystalline silicon to polysilicon near the crevice 1102 and upon contact with one of the first or second insulator liners 112a, 112b.

As shown in the cross-sectional view 1100B of FIG. 11B, the polysilicon growth process 1101 during a second time greater than the first time is illustrated. The polysilicon 1104 continues to grow in the first and second trenches 804a, 804b in a bottom-up direction 1103. Because of the conditions of the furnace and the composition and concentration of the first precursor, the polysilicon 1104 continues to selectively grow from itself in the bottom-up direction 1103 and the growth of polysilicon 1104 does not originate from the first and second insulator liners 112a, 112b or from the masking structure 508. In some embodiments, the selective conditions of the furnace may be as follows: a temperature of approximately 1040 degrees Celsius, a pressure of approximately 80 Torr, approximately 1.29 percent of the surface area of the substrate 101 uncovered by an oxide, and a ratio of HCl to DCS of about 5.7, where the HCl has a flow rate of approximately 400 standard cubic centimeters per minute and where the DCS has a flow rate of approximately 70 standard cubic centimeters per minute. Further, in some embodiments, the polysilicon 1104 is doped during its deposition. For example, in some embodiments, it may be doped using, for example, boron mixed with hydrogen ($B_2H_6$) at a flow rate of approximately 200 standard cubic centimeters per minute, such that the polysilicon 1104 can be more effectively biased for electrical isolation. Such selective conditions may allow the growth rate of the polysilicon 1104 to be equal to about 2 micrometers per minute. As a result of a high growth rate, the polysilicon 1104 may have an average grain size greater than 300 nanometers. Further, because of the polysilicon growth process 1101 is selective, the polysilicon 1104 may grow in the bottom-up direction 1103, mitigating void entrapment.

As shown in the cross-sectional view 1100C of FIG. 11C, at a predetermined time of the polysilicon growth process 1101 after the second time, the polysilicon 1104 may have a top surface at a same or about a same level as the top surface 101t of the substrate 101. Thus, in some embodiments, because of the bottom-up direction 1103 of the polysilicon growth process 1101, the polysilicon 1104 has minimal voids and may have a top surface at or below the top surface 101t of the substrate 101. Further, in some embodiments, the polysilicon 1104 may have a substantially flat or planar top surface. In some embodiments, the polysilicon growth process 1101 may be stopped at the predetermined time, such that the top surface of the polysilicon 1104 is at a same or about the same level as the top surface 101t of the substrate 101. In some embodiments, the top surface of the polysilicon 1104 may be just below the top surface 101t of the substrate 101 (see, FIG. 2A), In such embodiments where the polysilicon growth process 1101 is stopped at the predetermined time, the method may continue to FIG. 13, and thus, skipping the steps in FIG. 11D and FIG. 12.

As shown in the cross-sectional view 1100D of FIG. 11D, in some embodiments, the polysilicon growth process 1101 may continue to a fourth time after the predetermined time, such that the polysilicon 1104 may grow above the top surface 101t of the substrate 101. Although more polysilicon 1104 may be grown compared to the cross-sectional view 1100C of FIG. 11C, the polysilicon 1104 may still be free or mostly free of voids due to the polysilicon growth process 1101 in the bottom-up direction 1103.

Figure 12:
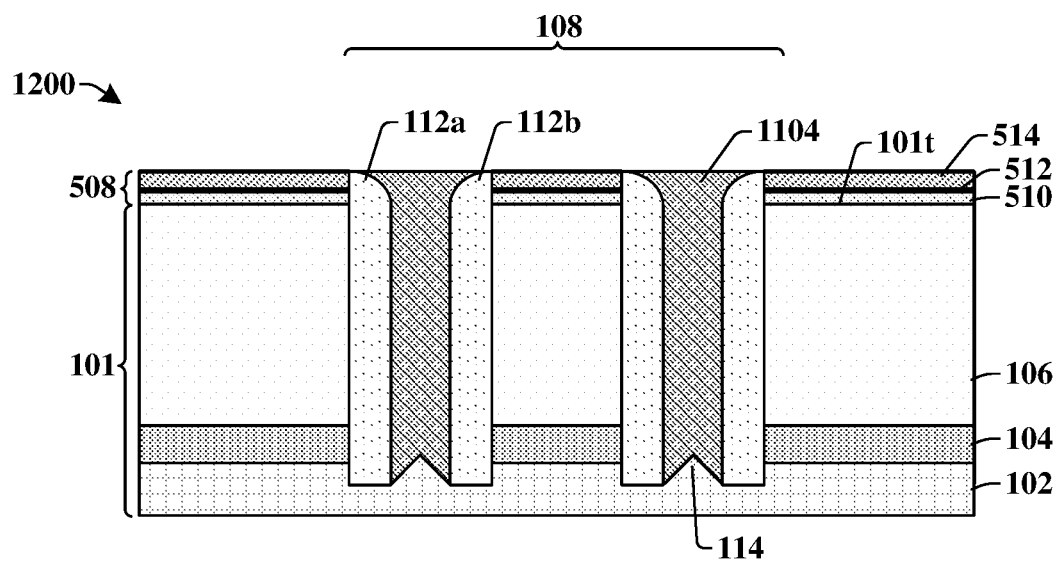

As shown in the cross-sectional view 1200 of FIG. 12, if the polysilicon growth process (1101 of FIG. 11D) is grown above the top surface 101t of the substrate 101, as in FIG. 11D, a planarization process is performed on the polysilicon 1104. The planarization process (e.g., chemical mechanical planarization) may be performed such that the polysilicon 1104, the first and second insulator liners 112a, 112b, and the masking structure 508 have substantially coplanar upper surfaces.

Figure 13:
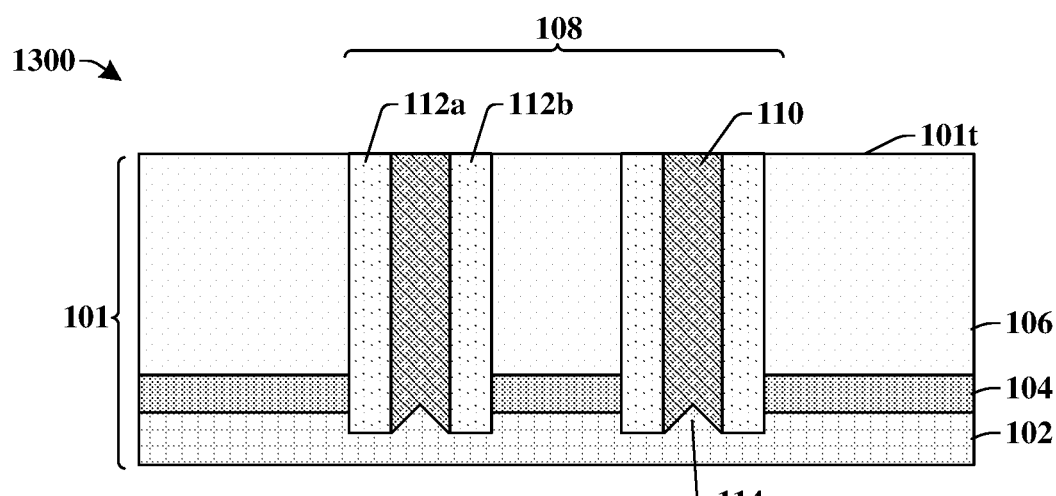

As shown in the cross-sectional view 1300 of FIG. 13, the masking structure (508 of FIG. 12) is removed. In some embodiments, the masking structure (508 of FIG. 12) may be removed by a planarization process (e.g., chemical mechanical planarization). In some embodiments, the planarization process of FIG. 12 and the planarization process of FIG. 13 may be a single and same planarization process. After the removal of the masking structure (508 of FIG. 12), deep trench isolation (DTI) structures 108, each of which comprise a polysilicon isolation structure 110, are embedded within the substrate 101 and the DTI structures 108 have upper surfaces that are substantially coplanar with the top surface 101t of the substrate 101.

In some embodiments, the removal of the masking structure (508 of FIG. 12) also removes portions of the polysilicon (1104 of FIG. 12), if the polysilicon growth process 1101 results in polysilicon (1104 of FIG. 12) that is higher than the top surface 101t of the substrate 101 (see, FIG. 11D).

In other embodiments, the removal of the masking structure (508 of FIG. 12) proceeds the embodiment of FIG. 11C, thereby skipping the steps in FIG. 11D and FIG. 12. Thus, during the planarization process to remove the masking structure (508 of FIG. 12), polysilicon (1104 of FIG. 11C) is not removed. Thus, by stopping the polysilicon growth process (1101 of FIG. 11C) at the predetermined time, the planarization process illustrated in the cross-sectional view 1200 of FIG. 12 may be omitted, thereby saving material and increasing throughput.

Figure 14:
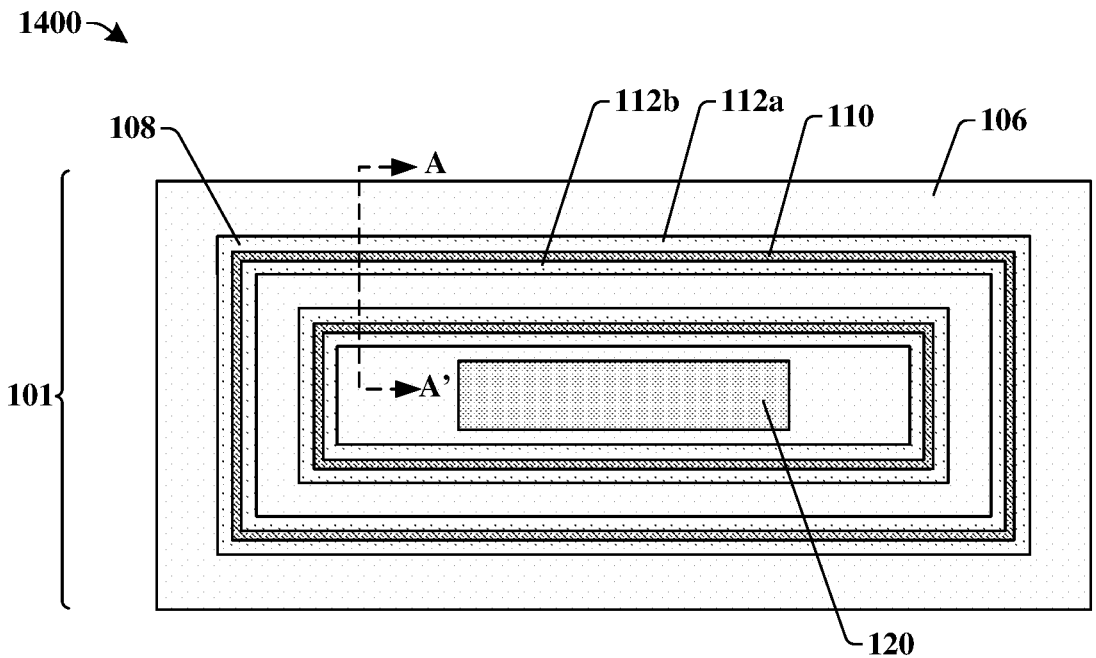

As shown in the top-view 1400 of FIG. 14, a semiconductor device 120 may be formed such that the DTI structures 108 continuously surround the semiconductor device 120. In some embodiments, the semiconductor device 120 may be, for example, a transistor device such as a metal oxide semiconductor field effect transistor (MOSFET). The semiconductor device 120 may be manufactured using common manufacturing methods such as deposition of layers, photolithography, and etching processes.

Figure 15:
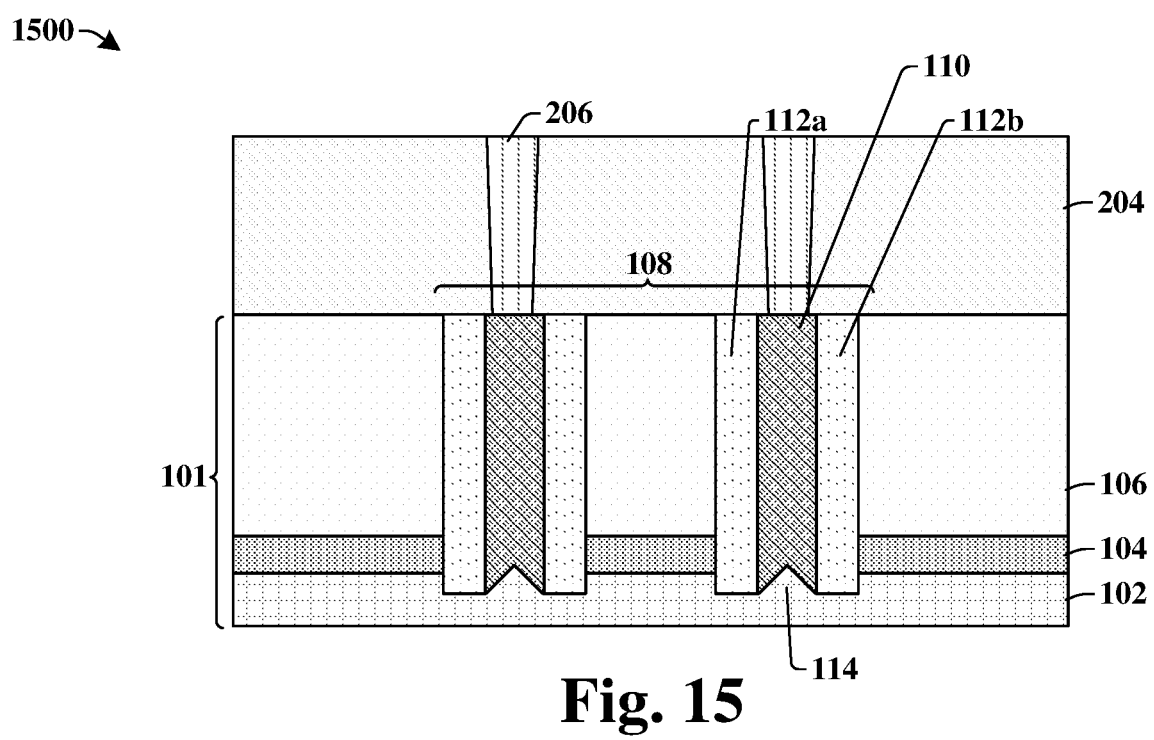

As shown in the cross-sectional view 1500 of FIG. 15, in some embodiments, a dielectric structure 204 may be formed over the substrate 101, and isolation contacts 206 may be formed in the dielectric structure 204 and coupled to each polysilicon isolation structure 110 of the DTI structures 108. In some embodiments, the dielectric structure 204 may comprise, for example, nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. The dielectric structure 204 and the isolation contacts 206 may be formed after the formation of a semiconductor device (120 of FIG. 14) surrounded by the DTI structures 108. The isolation contacts 206 may supply a bias to the polysilicon isolation structures 110 free of voids such that the DTI structures 108 provide sufficient electrical isolation for the semiconductor device (120 of FIG. 14).

Figure 16:
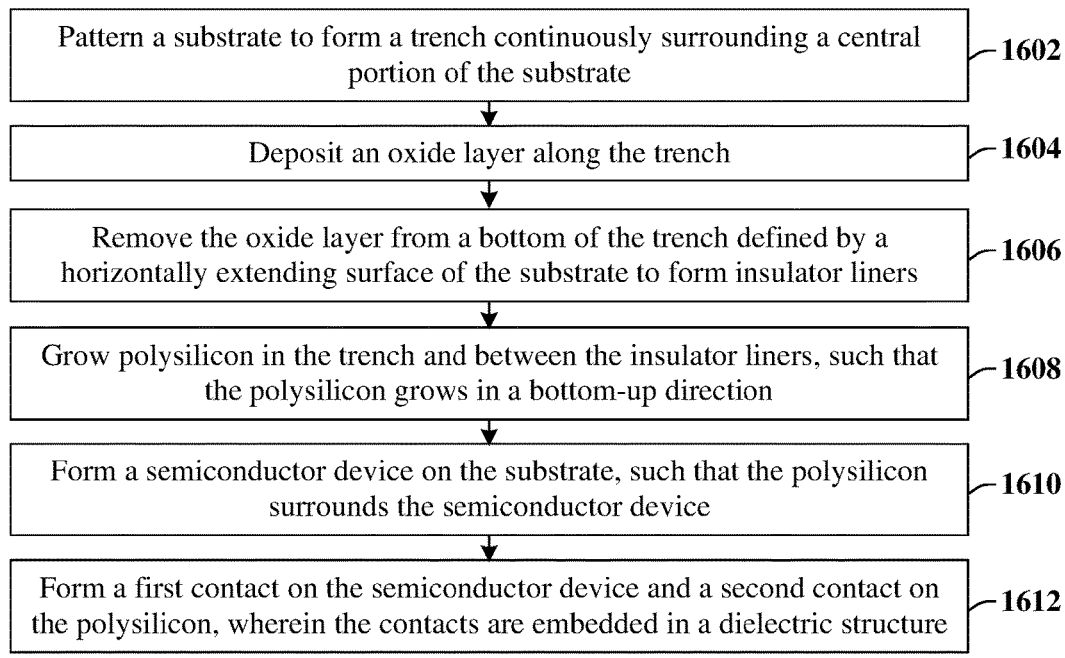
FIG. 16 illustrates a flow diagram of some embodiments of a method describing FIGS. 4-15.

FIG. 16 illustrates a flow diagram of some embodiments of a method 1600 of forming the DTI structures as illustrated in FIGS. 4-15.

While method 1600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1602, a substrate is patterned to form a trench continuously surrounding a central portion of the substrate. FIG. 8A illustrates a cross-sectional view 800A of some embodiments corresponding to act 1602.

At act 1604, an oxide layer is deposited along the trench. FIG. 9 illustrates a cross-sectional view 900 of some embodiments corresponding to act 1604.

At act 1606, the oxide layer is removed from a bottom of the trench defined by a horizontally extending surface of the substrate to form insulator liners. FIG. 10A illustrates a cross-sectional view 1000A of some embodiments corresponding to act 1606.

At act 1608, polysilicon is grown in the trench and between the insulator liners, such that the polysilicon grows in a bottom-up direction. FIGS. 11A-11D illustrates cross-sectional views 1100A-1100D of some embodiments corresponding to act 1608.

At act 1610, a semiconductor device is formed on the substrate, such that the polysilicon surrounds the semiconductor device. FIG. 14 illustrates top-view 1400 of some embodiments corresponding to act 1610.

At act 1612, a first contact is formed on the semiconductor device and a second contact is formed on the polysilicon, wherein the contacts are embedded in a dielectric structure. FIG. 15 illustrates a cross-sectional view 1500 of some embodiments corresponding to act 1612.

Therefore, the present disclosure relates to a method of forming a DTI structure filled with polysilicon that is substantially free of defects by growing the polysilicon in a bottom-up direction to provide reliable electrical isolation amongst various semiconductor devices integrated onto a same substrate.

Accordingly, in some embodiments, the present disclosure relates to an integrated chip, comprising: a semiconductor device disposed on a frontside of a substrate; a polysilicon isolation structure continuously surrounding the semiconductor device and extending from the frontside of the substrate towards a backside of the substrate; and a first insulator liner and a second insulator liner respectively surrounding a first outermost sidewall of the polysilicon isolation structure and a second outermost sidewall of the polysilicon isolation structure, wherein the substrate comprises a monocrystalline facet arranged between the first insulator liner and the second insulator liner, wherein a top of the monocrystalline facet is above bottommost surfaces of the polysilicon isolation structure, the first insulator liner, and the second insulator liner.

In other embodiments, the present disclosure relates to an integrated chip, comprising: a monocrystalline base layer; an active layer arranged over the monocrystalline base layer; an insulator layer separating the active layer from the monocrystalline base layer; a polysilicon isolation structure continuously separating an inner region of the active layer from an outer region of the active layer, wherein the polysilicon isolation structure extends through the active layer and into the monocrystalline base layer; and insulator liners covering outermost sidewalls of the polysilicon isolation structure and disposed over a horizontally extending surface of the monocrystalline base layer, wherein the monocrystalline base layer comprises a protrusion extending outward from the horizontally extending surface of the monocrystalline base layer and arranged between the insulator liners, the protrusion having a top above bottommost surfaces of the insulator liners and the polysilicon isolation structure.

In yet other embodiments, the present disclosure relates to a method of forming an isolation structure in a substrate, the method comprising: patterning the substrate to form a trench that continuously surrounds a central portion of the substrate, wherein the trench extends from a top surface of the substrate towards a bottom surface of the substrate in a first direction normal to the top surface of the substrate; depositing an insulator layer along the trench; removing the insulator layer from a horizontally extending surface of the substrate defining a bottom of the trench, such that insulator liners cover outer surfaces of the trench defined by sidewalls of the substrate; and growing polysilicon in the trench and between the insulator liners, wherein the polysilicon grows from the horizontally extending surface of the substrate towards a top surface of the substrate, in a second direction normal to the top surface of the substrate and opposite to the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, the method comprising:
    patterning a substrate to form a trench that continuously surrounds a central portion of the substrate, wherein the trench extends from a top surface of the substrate towards a bottom surface of the substrate in a first direction normal to the top surface of the substrate;
    depositing an insulator layer along the trench;
    removing the insulator layer from a horizontally extending surface of the substrate defining a bottom of the trench, such that insulator liners cover outer surfaces of the trench defined by sidewalls of the substrate;

growing monocrystalline silicon from the horizontally extending surface while etching the monocrystalline silicon to form a faceted structure with a surface extending along a (111) plane; and growing polysilicon in the trench and between the insulator liners, wherein the polysilicon is grown bottom up continuously from the faceted structure to an elevation at the top surface of the substrate, in a second direction normal to the top surface of the substrate and opposite to the first direction.

2. The method of claim 1, wherein the polysilicon is grown in a chamber using a first precursor comprising a ratio of hydrochloride gas to dichlorosilane gas that is between about 5 and about 8.

3. The method of claim 2, wherein the first precursor further comprises a boron gas such that the polysilicon is doped.

4. The method of claim 1, wherein the polysilicon is grown at a temperature of between about 850 degrees Celsius and about 1100 degrees Celsius and at a pressure of between about 10 Torr and about 300 Torr.

5. The method of claim 1, wherein the growing of the polysilicon has a growth rate greater than 2 micrometers per minute.

6. The method of claim 1, wherein the growing of the polysilicon is stopped at a predetermined time before the polysilicon grows past the top surface of the substrate.

7. The method according to claim 1, wherein the faceted structure has a triangular profile culminating in a point in the second direction.

8. The method according to claim 7, wherein the horizontally extending surface has a planar profile at a beginning of the growing of the monocrystalline silicon and has a non-planar profile at the faceted structure at completion of the growing of the monocrystalline silicon.

9. A method of forming an integrated chip, the method comprising:

providing a substrate comprising a base semiconductor layer, a dielectric layer overlying the base semiconductor layer, and an active semiconductor layer overlying the dielectric layer;

performing a first etch into the substrate to form a trench with a ring-shaped top geometry, wherein the trench extends through the active semiconductor layer and the dielectric layer into the base semiconductor layer to expose a semiconductor surface of the base semiconductor layer that faces a top of the trench and is spaced from the dielectric layer;

forming a sidewall spacer structure lining sidewalls of the substrate in the trench, and extending from the semiconductor surface to a top surface of the active semiconductor layer; and growing a polysilicon layer in the trench and extending from the semiconductor surface to a top surface of the sidewall spacer structure, wherein at least 98% of the active semiconductor layer is covered by oxide during the growing of the polysilicon layer, wherein the semiconductor surface has a planar profile at a beginning of the growing and has a non-planar profile with a triangular facet at completion of the growing, and wherein the triangular facet extends towards the top of the trench to culminate in a point.

10. The method according to claim 9, wherein the semiconductor surface is monocrystalline silicon and directly contacts the polysilicon layer.

11. The method according to claim 9, wherein the growing comprises exposing the semiconductor surface to a mixture of precursor gases including: a first gas causing deposition of the polysilicon layer; and a second gas simultaneously causing removal of the polysilicon layer.

12. The method according to claim 11, wherein a ratio of the second gas to the first gas is 5:1 to 10:1.

13. The method according to claim 9, wherein the polysilicon layer directly contacts the sidewall spacer structure continuously from the semiconductor surface to an elevation level with or elevated relative to the top surface of the active semiconductor layer.

14. A method of forming an integrated chip, the method comprising:

forming a mask atop a substrate;

performing a first etch into the substrate with the mask in place to form a trench extending laterally in a closed path around a device region, wherein the trench exposes a semiconductor surface of the substrate that faces a top of the trench;

depositing a dielectric spacer layer covering the mask and the semiconductor surface, and further lining sidewalls of the substrate in the trench;

performing a second etch into the dielectric spacer layer to form a sidewall spacer structure lining the sidewalls of the substrate in the trench, and to further expose the semiconductor surface; and growing a polysilicon layer selectively in the trench, such that the polysilicon layer grows vertically directly from the semiconductor surface to an elevation level with the mask without growing directly from the sidewall spacer structure, wherein the polysilicon layer is separated from the sidewalls of the substrate by the sidewall spacer structure, wherein the growing forms a faceted structure in the semiconductor surface, and wherein the faceted structure culminates in a point towards the top of the trench.

15. The method according to claim 14, wherein the sidewalls of the substrate in the trench have a planar profile from the semiconductor surface to the mask.

16. The method according to claim 14, wherein the polysilicon layer grows laterally at the top of the trench to cover the mask, and wherein the method further comprises:

performing a planarization into the polysilicon layer to uncover the mask.

17. The method according to claim 16, wherein the planarization further extends into the mask to remove the mask and expose a top surface of the substrate.

18. The method according to claim 14, further comprising:

forming a metal oxide semiconductor field effect transistor (MOSFET) on the device region after the growing, the MOSFET comprising a source region, a drain region, a gate electrode between the source and drain regions, and a body region underlying the gate electrode and the source and drain regions, wherein the source and drain regions and the body region are in the substrate, and wherein the source and drain regions are spaced from the trench by the body region, which has an opposite doping type as the source and drain regions.

19. The method according to claim 18, wherein the substrate comprises a base semiconductor layer, a dielectric layer overlying the base semiconductor layer, and an active semiconductor layer overlying the dielectric layer, wherein the active semiconductor layer accommodates the body region of the MOSFET, and wherein the active semiconductor layer has a doping type of the body region continuously from the body region to a sidewall of the trench and further has the doping type at the sidewall continuously from a top edge of the sidewall to the dielectric layer.

20. The method according to claim 14, wherein the semiconductor surface has a planar profile at a beginning of the growing and a triangular profile at completion of the growing, and wherein the triangular profile corresponds to the faceted structure.

\* \* \* \* \*